United States Patent
Dogiamis et al.

(10) Patent No.: US 10,573,608 B2
(45) Date of Patent: Feb. 25, 2020

(54) MICROELECTRONIC DEVICES DESIGNED WITH HIGH FREQUENCY COMMUNICATION DEVICES INCLUDING COMPOUND SEMICONDUCTOR DEVICES INTEGRATED ON A DIE FABRIC ON PACKAGE

(71) Applicant: INTEL CORPORATION, Santa Clara, CA (US)

(72) Inventors: Georgios C. Dogiamis, Chandler, AZ (US); Telesphor Kamgaing, Chandler, AZ (US); Eric J. Li, Chandler, AZ (US); Javier A. Falcon, Chandler, AZ (US); Yoshihiro Tomita, Ibaraki (JP); Vijay K. Nair, Mesa, AZ (US); Shawna M. Liff, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/776,021

(22) PCT Filed: Dec. 22, 2015

(86) PCT No.: PCT/US2015/000156
§ 371 (c)(1),
(2) Date: May 14, 2018

(87) PCT Pub. No.: WO2007/111766
PCT Pub. Date: Jun. 29, 2017

(65) Prior Publication Data
US 2018/0331051 A1    Nov. 15, 2018

(51) Int. Cl.
*H01L 23/66* (2006.01)
*H01L 23/31* (2006.01)
(Continued)

(52) U.S. Cl.
CPC .......... *H01L 23/66* (2013.01); *H01L 23/3107* (2013.01); *H01L 23/49827* (2013.01);
(Continued)

(58) Field of Classification Search
CPC ....... H01L 23/66; H01L 23/552; H01L 23/58; H01L 23/49827; H01L 23/49838; H01L 23/3107; H01L 25/16
(Continued)

(56) References Cited

U.S. PATENT DOCUMENTS 7,351,660 B2*   4/2008   Brewer .................. G03F 7/0002
                                                            216/44
2003/0122079 A1*   7/2003   Pobanz .............. H01L 27/14649
                                                            250/336.1
(Continued)

OTHER PUBLICATIONS

International Preliminary Report on Patentability for PCT Patent Application No. PCT/US2015/000156 dated Jul. 5, 2018, 10 pgs.
International Search Report and Written Opinion for International Patent Application No. PCT/US2015/000156 dated Sep. 20, 2016, 13 pgs.

*Primary Examiner* — Dao H Nguyen
(74) *Attorney, Agent, or Firm* — Schwabe, Williamson & Wyatt P.C.

(57) ABSTRACT

Embodiments of the invention include a microelectronic device that includes a first die having a silicon based substrate and a second die coupled to the first die. In one example, the second die is formed with compound semiconductor materials. The microelectronic device includes a substrate that is coupled to the first die with a plurality of electrical connections. The substrate including an antenna unit for transmitting and receiving communications at a frequency of approximately 4 GHz or higher.

22 Claims, 7 Drawing Sheets

(51) Int. Cl.
*H01L 23/498* (2006.01)
*H01L 23/552* (2006.01)
*H01L 25/16* (2006.01)

(52) U.S. Cl.
CPC ...... *H01L 23/49838* (2013.01); *H01L 23/552* (2013.01); *H01L 25/16* (2013.01); *H01L 2223/6677* (2013.01)

(58) Field of Classification Search
USPC ........ 257/659, 619, 690, 738, 774, E25.012, 257/E25.029, E27.136, E21.502, E21.705; 174/250, 252, 255, 260; 343/841, 851, 343/893; 361/679.31, 719, 720; 438/25, 438/26, 42, 44
See application file for complete search history.

(56) References Cited

U.S. PATENT DOCUMENTS

| | | | |
|---|---|---|---|
| 2009/0322643 | A1 | 12/2009 | Choudhury |
| 2011/0187602 | A1 | 8/2011 | Nair et al. |
| 2012/0119932 | A1* | 5/2012 | MacDonald ........... H01Q 1/425 342/1 |
| 2013/0009320 | A1* | 1/2013 | Yoo ................... H01L 23/49827 257/774 |
| 2014/0110841 | A1 | 4/2014 | Beer et al. |
| 2014/0266902 | A1 | 9/2014 | Kamgaing et al. |
| 2014/0293529 | A1* | 10/2014 | Nair .................... H01Q 1/2291 361/679.31 |

\* cited by examiner

MICROELECTRONIC DEVICES DESIGNED WITH HIGH FREQUENCY COMMUNICATION DEVICES INCLUDING COMPOUND SEMICONDUCTOR DEVICES INTEGRATED ON A DIE FABRIC ON PACKAGE

CROSS-REFERENCE TO RELATED APPLICATION

This patent application is a U.S. National Phase Application under 35 U.S.C. § 371 of International Application No. PCT/US2015/000156, filed Dec. 22, 2015, entitled "MICROELECTRONIC DEVICES DESIGNED WITH HIGH FREQUENCY COMMUNICATION DEVICES INCLUDING COMPOUND SEMICONDUCTOR DEVICES INTEGRATED ON A DIE FABRIC ON PACKAGE," which designates the United States of America, the entire disclosure of which is hereby incorporated by reference in its entirety and for all purposes.

FIELD OF THE INVENTION

Embodiments of the present invention relate generally to the manufacture of semiconductor devices. In particular, embodiments of the present invention relate to microelectronic devices having high frequency communication devices integrated on a die fabric on package.

BACKGROUND OF THE INVENTION

Future wireless products are targeting operation frequencies much higher than the lower GHz range utilized presently. For instance 5G ($5^{th}$ generation mobile networks or $5^{th}$ generation wireless systems) communications is expected to operate at a frequency greater than or equal to 15 GHz. Moreover, the current WiGig (Wireless Gigabit Alliance) products operate at 60 GHz. Other applications including automotive radar and medical imaging, utilize wireless communication technologies in the millimeter wave frequencies (e.g. 30 GHz-300 GHz). For these wireless applications, the designed RF (radio frequency) circuits are in need of high quality passive matching networks, in order to accommodate the transmission of pre-defined frequency bands (where the communication takes place) as well as in need of high power efficiency amplifiers and low loss, power combiners/switches.

DETAILED DESCRIPTION OF THE INVENTION

Figure 1:
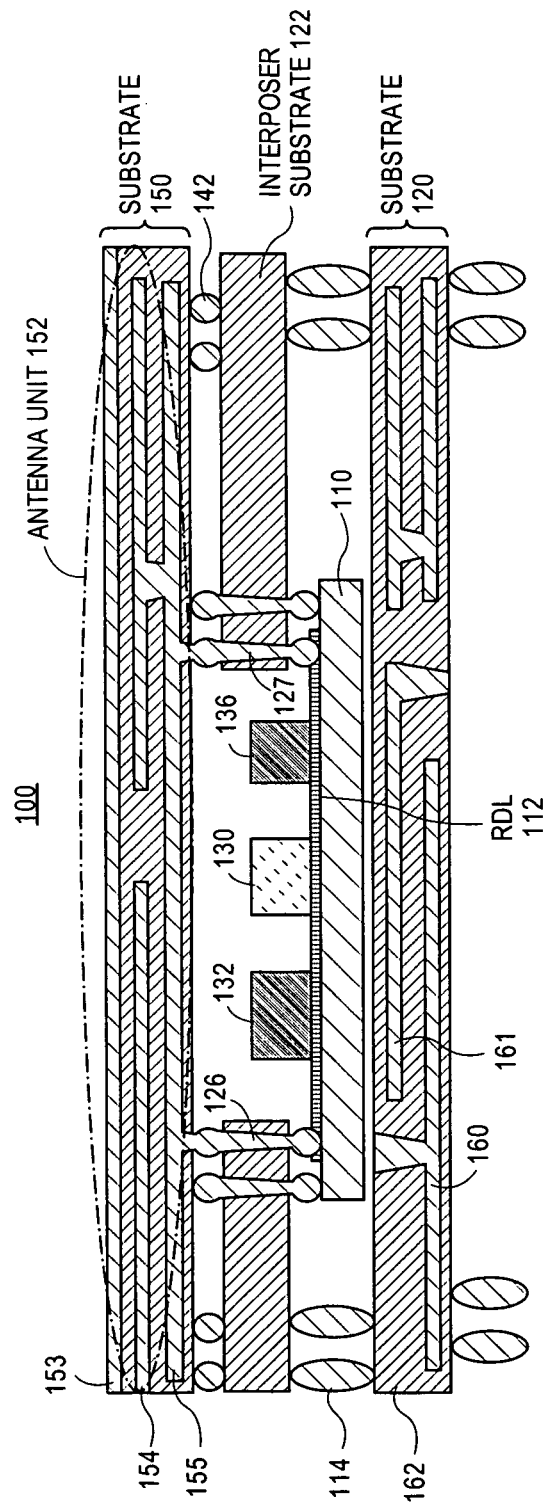
FIG. 1 illustrates co-integrating different components in a microelectronic device (e.g., a die fabric architecture) in accordance with one embodiment.

Described herein are microelectronic devices that are designed with high frequency communication devices including compound semiconductor devices in an inter die fabric on package. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order to not obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

For high frequency (e.g., 5G, WiGig) wireless applications of millimeter (e.g., 1-10 mm, any mm wave) wave communication systems, the designed RF circuits (e.g., low-noise amplifiers, mixers, power amplifiers, etc.) are in need of high quality passive matching networks, in order to accommodate the transmission of pre-defined frequency bands where the communication takes place as well as in need of high efficiency power amplifiers, and low loss, power combiners/switches, etc. CMOS technology for greater than 15 GHz operation can be utilized, but with decreased power amplifier efficiencies and with low quality passives, mainly due to the typically lossy silicon substrate employed. This results not only in a lower system performance, but also in increased thermal requirements due to the excess heat generated. In one example, the high thermal dissipation is due to the fact that multiple power amplifiers have to be utilized in a phased array arrangement to achieve the desired output power and transmission range. This will be even more stringent on 5G systems as the typical transmission range for cellular network (e.g., 4G, LTE, LTE-Adv) is several times larger than that required for connectivity (e.g., WiFi, WiGig).

The present design includes high frequency components (e.g., 5G transceiver) and utilizes non-CMOS technologies (e.g., non-silicon substrates) for critical parts of a communication system (e.g., GaAs, GaN, Passives-on-Glass, etc.). With an optimal system partitioning, critical parts requiring high efficiencies and high quality factors can be fabricated on another technology (e.g., compound semiconductor materials, group III-V materials). These parts might be either on device level (e.g., transistors on GaN/GaAs) or on circuit level (e.g., III-V die integrating a power amplifier, a low noise amplifier, etc.). The full communication system will be formed in an inter die-fabric manner, as discussed in embodiments of this invention.

The present design technology allows co-integrating dies and/or devices that are fabricated on different technologies and/or substrates on the same package for performance enhancement and relaxation of thermal requirements. The package might include antenna units for communication with other wireless systems.

In one embodiment, the present design is a 5G ($5^{th}$ generation mobile networks or $5^{th}$ generation wireless systems) architecture having non-CMOS based transceiver building blocks (such as group III-V based devices or dies) that are co-integrated on the same package with low frequency circuits and integrated passive devices (IPDs) for performance enhancement and thermal requirements relaxation. In this arrangement, dies are assembled on top of a primary die (e.g., CMOS die), which is then assembled on package. The package may have antennas directly integrated onto it. The 5G architecture operates at a high frequency (e.g., at least 20 GHz, at least 25 GHz, at least 28 GHz, at least 30 GHz, etc.) and may also have approximately 1-50 gigabits per second (Gbps) connections to end points.

In one example, the present design architecture includes a non-CMOS transceiver building blocks (e.g., group III-V dies) or integrated passive devices or dies (IPDs) are initially assembled on a CMOS die having low frequency circuits (e.g., frequency less than 30 GHz, frequency less than 20 GHz) and then integrated with an antenna package. This design architecture results in performance enhancement, miniaturization, and thermal requirements relaxation. In this architecture, the components can be assembled using diverse manufacturing approaches (e.g., assembled at wafer level). A final communication module may utilize integrated antennas.

The design of this 5G architecture provides optimized performance for high frequency transceivers based on using compound semiconductor materials for certain components (e.g., switches, power amplifier) and integrated passive devices or dies (IPDs) for better quality passives. The present design can include, through mold interconnects, thru mold vias, thru substrate vias, or vias from a first substrate or first die to a second substrate or die for vertically passing high frequency (e.g., at least 25 GHz) RF signals to the second substrate or the second die (e.g., the second substrate or die is vertically aligned with the first substrate or the first die) which leads to a shorter path for the RF signals and thus less path loss. The present design also results in reduced cost due to having a first substrate designed for antennas or antenna components and a second substrate designed for higher frequency components. The functional testing of transceiver components, which may utilize in-mold-circuits, are decoupled from the need to assemble them initially on the package. Additionally, a wireless 5G module, which comprises RFIC with or without on-package antenna, can be designed and sold as a separate module. Functional blocks such as impedance matching circuits, harmonic filters, couplers, power combiner/divider, etc. can be implemented with IPDs. IPDs are generally fabricated using wafer fab technologies (e.g., thin film deposition, etch. photolithography processing).

Partitioning the 5G transceiver efficiently allows this architecture to reduce power consumption, decrease thermal requirements, and achieve higher power amplifier efficiencies (e.g., using group III-V technologies) with improve passives (e.g., utilizing IPDs and more efficient power combiners or switches) due to fabricating the passives on a non-CMOS substrate. The present architecture provides an ability to integrate all of these different discrete components on package together with the antenna to create a full 5G transceiver. These components can either be on a device level (e.g., discrete transistors) or on a circuit level (e.g., a power amplifier, a low noise amplifier).

FIG. 1 illustrates co-integrating different components in a microelectronic device (e.g., a die fabric architecture) in accordance with one embodiment. The microelectronic device 100 (e.g., a die fabric architecture 100) includes CMOS circuitry of a die 110 (e.g., die with silicon based substrate, CMOS circuitry having at least one baseband unit and at least one transceiver unit formed with a silicon based substrate, CMOS die), circuitry or devices (e.g., individual transistors, groups of transistors) of a die 132 formed with compound semiconductor materials (e.g., group III-V materials, gallium arsenide (GaAs), gallium nitride (GaN), compound semiconductor die, etc.) or organic materials, circuitry or devices of a die 136 having formed with compound semiconductor materials (e.g., group III-V materials, gallium arsenide (GaAs), gallium nitride (GaN), compound semiconductor die, etc.) or organic materials, IPD 130, and substrate 150 having antenna unit 152 with at least one antenna for transmitting and receiving high frequency communications (e.g., 5G, WiGig, at least 25 GHz, at least 28 GHz, at least 30 GHz). The substrate 150 may optionally include various components (e.g., switches, switches formed in compound semiconductor materials, any type of device or circuitry, filters, combiners, etc). Additional components such as traditional surface-mount passives may also be mounted to the package. In addition, the components (e.g., 132, 130, 136) of FIG. 1 may be overmolded and covered with an external shield. The mold material may be a low loss nonconductive dielectric material and the shielding may be made out of a conductive material. The substrate 150 includes conductive layers 153-155. In this example, the vias 126 and 127 couple the circuitry 132 and 136 of a compound semiconductor die, the IPD 130, and the die 110 to the antenna unit 152 via a routing layer 112 (or redistribution layer) for electrical connections between these components. The substrate 120 includes one or more dielectric layers 162 for isolation between conductive layers 160 and 161.

In one embodiment, the die 110 is flip-chipped on one side of the interposer substrate 122. If a total height of die 110 and a tallest component (e.g., compound semiconductor dies 132 and 136, IPD 134) that is supported by the die 110 is greater than a certain height (e.g., greater than 100 microns) then an interposer substrate 122 or pillars are needed for assembling the substrate above the interposer substrate 122. If a total height of die 110 and the tallest component (e.g., compound semiconductor dies 132 and 136, IPD 134) is less than a certain height (e.g., 100 microns) then bumps can be used instead of the interposer substrate. In one example, the interposer substrate 122 has a useful function of providing shielding of the RF dies (e.g., dies 132, 136). Grounded deep vias of the interposer substrate can provide shielding while other components of the interposer substrate can provide a power supply for the microelectronic device 100.

The substrate 150 can have a different thickness, length, and width dimensions in comparison to a thickness, length, and width dimensions of the substrate 120. In one example, components of the substrate which primarily dominate a packaging area are partitioned in a separate lower cost and lower circuit density substrate 150 in comparison to the substrate 120, which may have high density interconnect (HDI) and impedance controlled interconnect. A substrate may be formed with low temperature ceramic materials, liquid crystal polymers, organic materials, glass, etc. HDI PCB technologies may include blind and/or buried via processes and possibly microvias with a higher circuit density than traditional PCBs. In this manner, an area of the substrate 120 without antenna components is reduced to reduce cost in comparison to a planar structure that includes antenna components. The substrate 120 may be formed with any materials (e.g., organic materials, laminate substrates, materials for formation of CPUs, etc) that are designed for high frequency designs having desirable high frequency characteristics (e.g., substrate loss, dielectric constant).

The die 110 may include complementary metal-oxide-semiconductor (CMOS) circuitry (e.g., CMOS circuitry formed with a silicon based substrate). The antenna unit 152 includes one or more conductive layers. The solder balls or bumps 142 couple the substrate 150 to the interposer substrate 122 while the solder ball, bumps, or pillars 114 couple the interposer substrate to the substrate 120. The interposer substrate 122 may be replaced with metal pillars or bumps with or without cavities if a smaller spacing (e.g., less than 100 microns) is needed between the substrate 150 and the substrate 120.

In one embodiment, high power, high efficiency power amplifiers, switches, and/or combiners are formed with compound semiconductor materials on the dies 132 and 136. which are directly assembled on the silicon die 110 with a routing layer 112 (or redistribution layer) separating the die 110 and the dies 132 and 136. The IPD 130 is assembled in a similar manner on the routing layer 112 and attached to a same side of the die 110. This process can be performed with diverse manufacturing processing techniques (e.g., assembled at wafer level on the CMOS silicon die 110). In one example, the die 110 can have dimensions ranging from approximately 200×200 microns to 1×1 millimeter. This multi die or multichip module, which includes dies 110, 130, 132, and 136, can then be flip-chipped on a high density interconnect package (e.g., interposer substrate 122) that provides power distribution as well as shielding of RF circuitry with peripheral ground vias.

In one embodiment, the antenna unit 152 is located on the microelectronic device 100 as close as possible to power amplifiers (e.g., power amplifiers of dies 132 or 136) to minimize path losses. The substrate 150 in FIG. 1 has been decoupled and separated from other substrates and components of the microelectronic device 100 to reduce cost of the device 100 due to lower cost materials for the substrate. In one example, the RF signals feeding the antenna unit 152 passes from at least one of the dies 132 and 136 through the routing layer 112 and then through vias of the interpose substrate 122 to the antenna unit 152.

Figure 2:
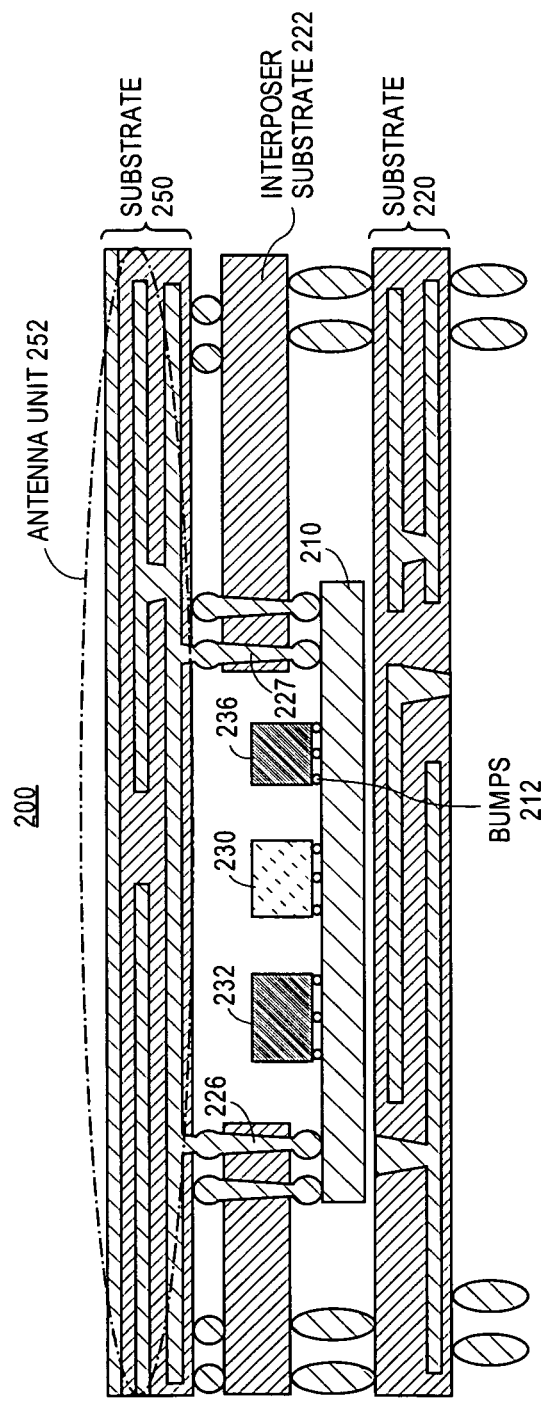
FIG. 2 illustrates co-integrating different components in a microelectronic device (e.g., a die fabric architecture) in accordance with one embodiment.

FIG. 2 illustrates co-integrating different components in a microelectronic device (e.g., a die fabric architecture) in accordance with one embodiment. The microelectronic device 200 includes similar components in comparison to the microelectronic device 100, except that the routing layer 112 has been replaced with solder balls or bumps. The device 200 (e.g., a die fabric architecture 200) includes circuitry or devices of a die 210 (e.g., die with silicon based substrate, CMOS circuitry with at least one baseband unit and at least one transceiver unit formed with a silicon based substrate, CMOS die), circuitry or devices of a die 232 formed with compound semiconductor materials (e.g., group III-V materials, gallium arsenide (GaAs), gallium nitride (GaN), compound semiconductor die. etc.), circuitry or devices of a die 236 formed with compound semiconductor materials (e.g., group III-V materials, gallium arsenide (GaAs), gallium nitride (GaN), compound semiconductor die, etc.), IPD 230, and substrate 250 having antenna unit 252 with at least one antenna for transmitting and receiving high frequency communications (e.g., 5G, WiGig, at least 4 GHz, at least 15 GHz, least 25 GHz, at least 28 GHz, at least 30 GHz). The substrate 250 includes conductive and insulating layers. In this example, the vias 226 and 227 couple the dies 232 and 236 of a compound semiconductor die, the IPD 230, and the die 210 to the antenna unit 252 via solder balls or bumps 212 and an upper conductive layer of the die 210 for electrical connections between these components. In one example, a pitch of the pads (and corresponding balls or bumps) of the dies 230, 232, and 236 matches or equals a pitch of the pads of the die 210.

If a total height of CMOS die 210 and a tallest component (e.g., compound semiconductor dies 232 and 236, IPD 234) that is supported by the CMOS die 210 is greater than a certain height (e.g., greater than 100 microns) then an interposer substrate 222 or pillars are needed for assembling the substrate above the interposer substrate 222. If a total height of CMOS die 210 and the tallest component (e.g., compound semiconductor dies 232 and 236. IPD 234) is less than a certain height (e.g., 100 microns) then bumps can be used instead of the interposer substrate. In one example, the interposer substrate 222 has a useful function of providing shielding of the RF dies (e.g., dies 232, 236). Grounded deep vias of the interposer substrate can provide shielding while other components of the interposer substrate can provide a power supply for the microelectronic device 200.

In one embodiment, high power, high efficiency power amplifiers, switches, and/or combiners are formed with compound semiconductor materials on the dies 232 and 236, which are directly assembled on the CMOS silicon die 210 with solder balls or bumps 212 separating the CMOS die 210 and the dies 232 and 236. The IPD 230 is assembled in a similar manner and attached to a same side of the die 210. This process can be performed with diverse manufacturing processing techniques (e.g., assembled at wafer level on the silicon die 210). In one example, the die 210 can have dimensions ranging from approximately 200×200 microns to 1×1 millimeter. This multi die or multichip module, which includes dies 210, 230, 232, and 236, can then be flip-chipped on a high density interconnect package (e.g., interposer substrate 222) that provides power distribution as well as shielding of RF circuitry with peripheral ground vias.

In one embodiment, the antenna unit 252 is located on the microelectronic device 200 as close as possible to power amplifiers (e.g., power amplifiers of dies 232 or 236) to minimize path losses. The substrate 250 in FIG. 2 has been decoupled and separated from other substrates and components of the microelectronic device 200 to reduce cost of the device 200 due to lower cost materials for the substrate. In one example, the RF signals feeding the antenna unit 252 passes from at least one of the dies 232 and 236 through the solder balls or bumps 212 to an upper conductive layer of the die 210 and then through vias of the interposer substrate 222 to the antenna unit 252.

Figure 4:
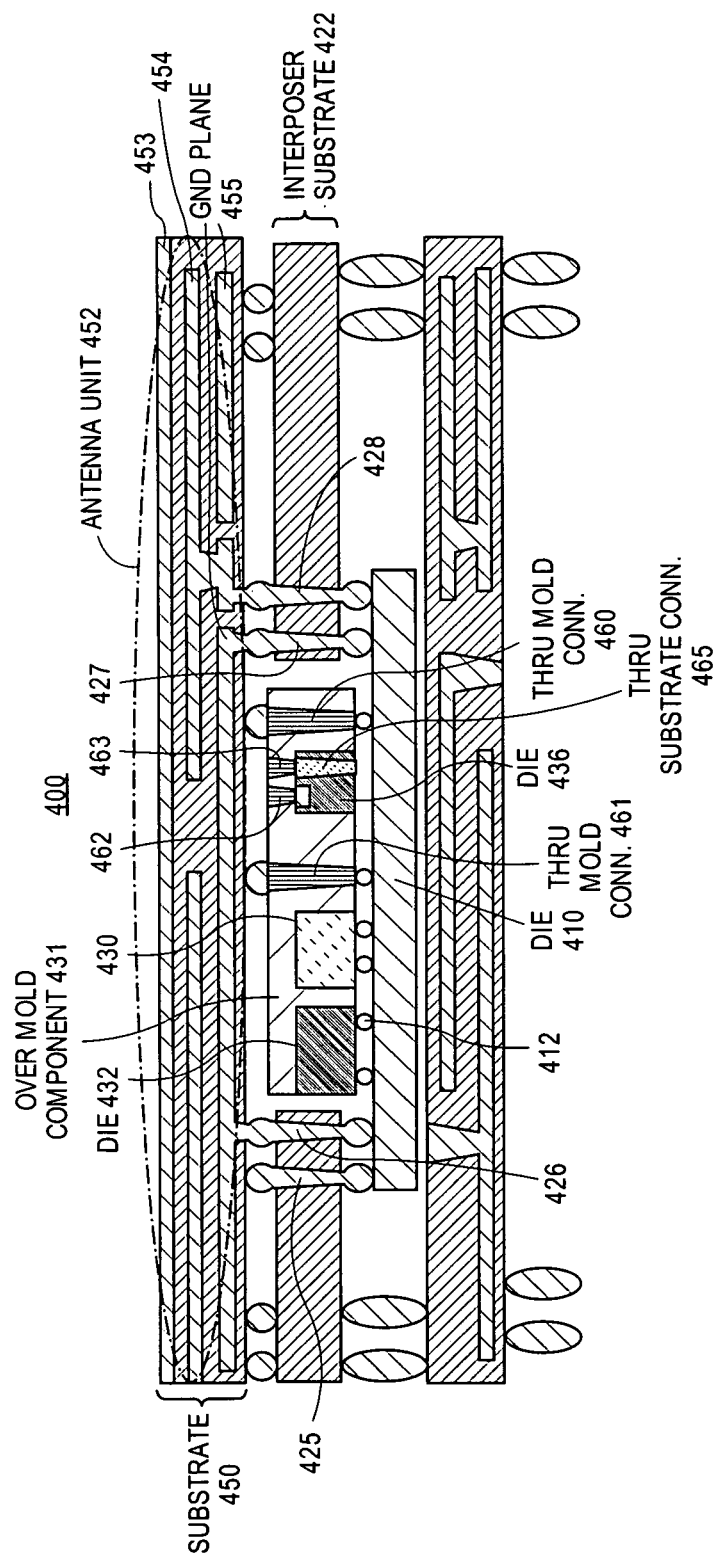
FIG. 4 illustrates co-integrating different components in a microelectronic device (e.g., a die fabric architecture) having an overmolded component in accordance with one embodiment.
Figure 5:
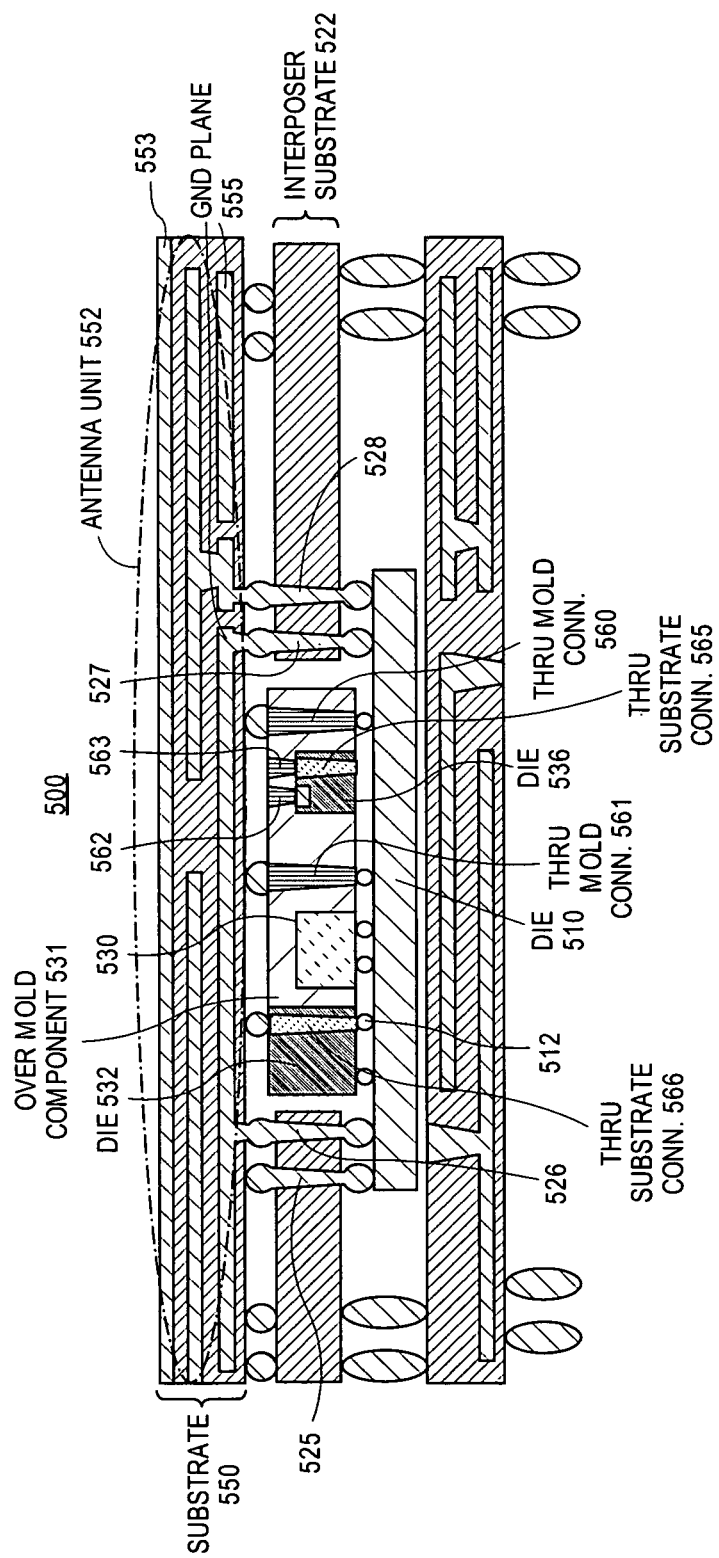
FIG. 5 illustrates co-integrating different components in a microelectronic device (e.g., a die fabric architecture) having an overmolded component in accordance with one embodiment.

FIGS. 1 and 2 illustrate embodiments in which RF signals are passed through an interposer substrate. To minimize losses, it is desirable to minimize a path length of the RF signals being sent to the substrate. FIGS. 3-5 illustrate embodiments in which high frequency RF signals can be passed from RF circuitry directly to an substrate without through an interpose substrate to further minimize losses.

Figure 3A:
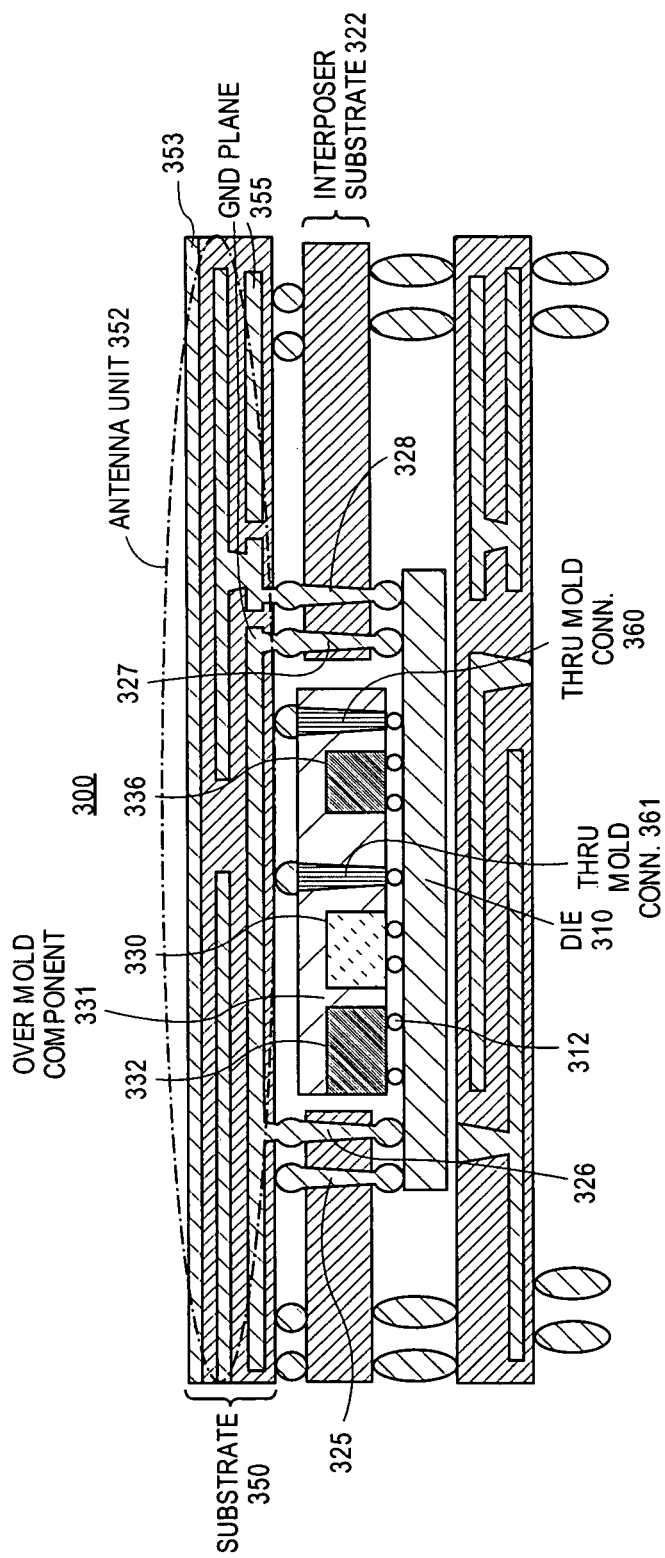
FIG. 3A illustrates co-integrating different components in a microelectronic device (e.g., a die fabric architecture) having an overmolded component in accordance with one embodiment.

FIG. 3A illustrates co-integrating different components in a microelectronic device (e.g., a die fabric architecture) having an overmolded component in accordance with one embodiment. The device 300 (e.g., a die fabric architecture 300) includes circuitry of a die 310 (e.g., die with silicon based substrate, CMOS circuitry having at least one baseband unit and at least one transceiver unit formed with a silicon based substrate, CMOS die), circuitry of a die 332 having devices formed with compound semiconductor materials (e.g., group materials, gallium arsenide (GaAs), gallium nitride (GaN), compound semiconductor die, etc.), circuitry of a die 336 having devices formed with compound semiconductor materials (e.g., group III-V materials, gallium arsenide (GaAs), gallium nitride (GaN), compound semiconductor die, etc.), IPD 330, and substrate 350 having antenna unit 352 with at least one antenna for transmitting and receiving high frequency communications (e.g., 5G, WiGig, at least 4 GHz, at least 15 GHz, at least 25 GHz, at least 28 GHz, at least 30 GHz). The dies 332, 330, and 336 can be assembled in an overmolded component 331. The substrate 350 includes conductive layers 353-355 and insulating layers. The substrate 350 may include various components (e.g., switches, switches formed in compound semiconductor materials, any type of device or circuitry, filters, combiners, etc). Lower conductive layer 355 can be a ground plane. In this example, the vias 325-328 couple the die 310 to the antenna unit 352.

A face down die 332, IPD 330, die 336, and thru mold connections 360-361 are coupled to the die 310 via solder balls or bumps. The thru mold connections 360-361 are coupled to the substrate 350 using solder balls or bumps. In this manner any signals including RF signals can be communicated between these components without passing through the interposer substrate 322 which reduces path losses. Additionally, an upper conductive layer of the die 310 can route signals from the die 310 or the components of the overmolded component 331 to the substrate 350 using vias of the interposer substrate 322 for electrical connections between these components. In one example, a pitch of the pads (and corresponding balls Or bumps) of the dies 330, 332, and 336 matches or equals a pitch of the pads of the die 310.

Figure 3B:
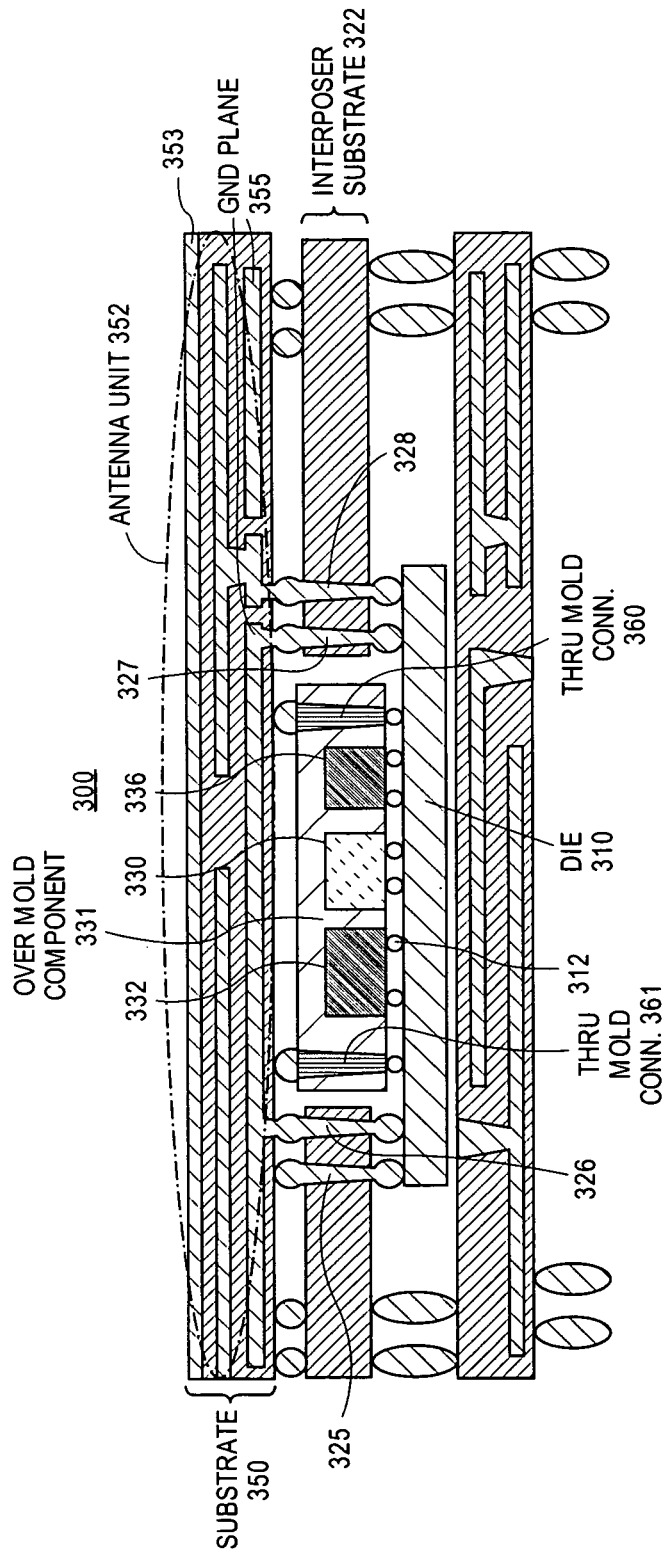
FIG. 3B illustrates co-integrating different components in a microelectronic device (e.g., a die fabric architecture) having an overmolded component with RF shielding in accordance with another embodiment.

If a total height of the overmolded component is greater than a certain height (e.g., greater than 50 microns, greater than 100 microns) then an interposer substrate 322 or pillars are needed for assembling the substrate above the interposer substrate 322. If a total height of the overmolded component is less than a certain height (e.g., 50 microns, 100 microns) then bumps can be used instead of the interposer substrate. In one example, the interposer substrate 322 has a useful function of providing shielding of the RF dies (e.g., dies 332, 336). Grounded deep vias of the interposer substrate can provide shielding while other components of the interposer substrate can provide a power supply for the microelectronic device 300. In another example, RF shielding of RF dies can be provided by an overmolded component that includes peripheral thru mold connections. FIG. 3B illustrates co-integrating different components in a microelectronic device (e.g., a die fabric architecture) having an overmolded component with RF shielding in accordance with another embodiment. FIG. 3B includes similar components or the same components in comparison to the components of FIG. 3A, except that the thru mold connection 361 has been replaced with a thru mold connection 362 located near a periphery of the overmolded component 331. The thru mold connections 360 and 362 provide RF shielding of components of the overmolded component 331 (e.g, dies 332 and 336, etc.).

In one embodiment, high power, high efficiency power amplifiers, switches, and/or combiners are formed with compound semiconductor materials on the dies 332 and 336, which are included in the overmolded component 331. The dies 332 and 336 are directly assembled on the silicon die 310 with solder balls or bumps 312 separating the CMOS die 310 and the dies 332 and 336. The IPD 330 is also attached to a same side of the die 310. In one example, the die 310 can have dimensions ranging from approximately 200×200 microns to 1×1 millimeter. This multi die or multichip module, which includes dies 310, 330, 332, and 336, can then be flip-chipped on a high density interconnect package (e.g., interposer substrate 322) that provides power distribution as well as shielding of RF circuitry with peripheral ground vias.

In one embodiment, the antenna unit 352 is located on the microelectronic device 300 as close as possible to power amplifiers (e.g., power amplifiers of dies 332 or 336) to minimize path losses. The substrate 350 in FIG. 3 has been decoupled and separated from other substrates and components of the microelectronic device 300 to reduce cost of the device 300 due to lower cost materials for the substrate. In one example, the RF signals feeding the antenna unit 352 passes from at least one of the dies 332 and 336 through the solder balls or bumps 312 to an upper conductive layer of the die 310 and then through vias of the interpose substrate 322 to the antenna unit 352.

An in-mold circuit reduces cost due to being able to test the in-mold circuit (overmold component) separately from the rest of the substrate before assembly. The present design creates an independent 5G module which can be manufactured and sold separately.

In one embodiment, die 310 is flip-chipped on one side of the microelectronic device (e.g., a die fabric architecture). In one example, the die 310 has a thickness of approximately 25-75 um (e.g., approximately 50 um). In one example, compound semiconductor materials (e.g., GaN, GaAs, etc.) have significantly higher electron mobility in comparison to Silicon materials which allows faster operation. Compound semiconductor materials also have wider band gap, which allows operation of power devices at higher temperatures, and give lower thermal noise to low power devices at room temperature in comparison to Silicon materials. Compound semiconductor materials also have a direct band gap which provides more favorable optoelectronic properties than an indirect band gap of Silicon. Passives needed for passive matching networks are integrated in the IPD 334, or passive power combiners or splitters can be assembled on the microelectronic device (e.g., a die fabric architecture). The components may be approximately drawn to scale or may not be necessarily drawn to scale depending on a particular architecture. In one example, for a frequency of approximately 30 GHz, an substrate 350 has dimensions of approximately 2.5 mm by 2.5 mm.

FIG. 4 illustrates co-integrating different components in a microelectronic device (e.g., a die fabric architecture) having an overmolded component in accordance with one embodiment. The device 400 (e.g., a die fabric architecture 400) includes circuitry of a die 410 (e.g., die with silicon based substrate, CMOS circuitry having at least one baseband unit and at least one transceiver unit formed with a silicon based substrate, CMOS die), circuitry or devices of a die 432 formed with compound semiconductor materials (e.g., group III-V materials, gallium arsenide (GaAs), gallium nitride (GaN), compound semiconductor die, etc.), circuitry or devices of a die 436 having devices formed with compound semiconductor materials (e.g., group III-V materials, gallium arsenide (GaAs), gallium nitride (GaN), compound semiconductor die, etc.), IPD 430, and substrate 450 having antenna unit 452 with at least one antenna for transmitting and receiving high frequency communications (e.g., 5G, WiGig, at least 4 GHz, at least 15 GHz, at least 25 GHz, at least 28 GHz, at least 30 GHz). The dies 432, 430, and 436 can be assembled in an overmolded component 431. The substrate 450 includes conductive layers 453-455 and insulating layers. A lower conductive layer 455 can be a ground plane. In this example, the connections (e.g., vias, Cu connections, etc.) 425-428 couple the die 410 to the antenna unit 452.

A face down die 432, IPD 430, and thru mold connections 460-461 are coupled to the die 410 via solder balls or bumps. The thru mold Compound semiconductor materials 460-463 are coupled to the substrate 450 using solder balls or bumps. The thru mold Compound semiconductor materials 462-463 couple a face up die 436 to the substrate 450. A thru mold Compound semiconductor material 463 is coupled to a thru substrate Compound semiconductor material 465 for an electrical connection between circuitry of the die 436 and the substrate 450. In this manner any signals including RF signals can be communicated between these components without passing through the interposer substrate 422 which reduces path losses. Additionally, an upper conductive layer of the die 410 can route signals from the die 410 or the electrically coupled components of the overmolded component 431 to the substrate 450 using connections (or vias) of the interposer substrate 422 for electrical connections between these components. In one example, a pitch of the pads (and corresponding balls or bumps) of the dies 430, 432, and 436 matches or equals a pitch of the pads of the die 410.

If a total height of the overmolded component is greater than a certain height (e.g., greater than 50 microns, greater than 100 microns) then an interposer substrate 422 or pillars are needed for assembling the substrate above the interposer substrate 422. If a total height of the overmolded component is less than a certain height (e.g., 50 microns, 100 microns) then bumps can be used instead of the interposer substrate. In one example, the interposer substrate 422 has a useful function of providing shielding of the RF dies (e.g., dies 432, 436). Grounded deep vias of the interposer substrate can provide shielding while other components of the interposer substrate can provide a power supply for the microelectronic device 400. In another example, RF shielding of dies located within the overmolded component 431 can be provided by using peripheral thru mold connections (e.g., thru mold connection 460). A thru mold connection 461 can be replaced with a thru mold connection that is located near a periphery of the overmolded component 431 or an additional thru mold connection can be added near a periphery of the component 431 (e.g., opposite the thru mold connection 460).

In one embodiment, high power, high efficiency power amplifiers, switches, and/or combiners are formed with compound semiconductor materials on the dies 432 and 436, which are included in the overmolded component 431. The dies 432 and 430 are directly assembled on the silicon die 410 with solder balls or bumps 412 separating the die 410 and the dies 432 and 430. In one example, the die 410 can have dimensions ranging from approximately 200×200 microns to 1×1 millimeter. This multi die or multichip module, which includes dies 410, 430, 432, and 436, can then be flip-chipped on a high density interconnect package (e.g., interposer substrate 422) that provides power distribution as well as shielding of RF circuitry with peripheral ground vias.

In one embodiment, the antenna unit 452 is located on the microelectronic device 400 as close as possible to power amplifiers (e.g., power amplifiers of dies 432 or 436) to minimize path losses. The substrate 450 in FIG. 4 has been decoupled and separated from other substrates and components of the microelectronic device 400 to reduce cost of the device 400 due to lower cost materials for the substrate. In one example, the signals feeding the antenna unit 452 pass over thru mold connections or thru substrate connections (e.g., 460, 461, 463, 465, etc.) for shorter RF path and thus reduced losses. In one another, the signals feeding into the substrate 450 passes from at least one of the dies 436, 432, and 430 through the solder balls or bumps 412 to an upper conductive layer of the die 410 and then through connections (or vias) of the interpose substrate 422 to the substrate 450.

FIG. 5 illustrates co-integrating different components in a microelectronic device (e.g., a die fabric architecture) having an overmolded component in accordance with one embodiment. The device 500 (e.g., a die fabric architecture 500) includes circuitry or devices of a die 510 (e.g., die with silicon based substrate. CMOS circuitry having at least one baseband unit and at least one transceiver unit formed with a silicon based substrate, CMOS die), circuitry or devices of a die 532 having devices formed with compound semiconductor materials (e.g., group III-V materials, gallium arsenide (GaAs), gallium nitride (GaN) or organic materials, compound semiconductor die, etc.), circuitry or devices of a die 536 having devices formed with compound semiconductor materials (e.g., group materials, gallium arsenide (GaAs), gallium nitride (GaN), compound semiconductor die, etc.) or organic materials, IPD 530, and substrate 550 having antenna unit 552 with at least one antenna for transmitting and receiving high frequency communications (e.g., 5G, WiGig, at least 4 GHz, at least 15 GHz, at least 25 GHz, at least 28 GHz, at least 30 GHz). The dies 532, 530, and 536 can be assembled in an overmolded component 531. The substrate 550 includes conductive layers 553-555 and insulating layers. A lower conductive layer 555 can be a ground plane. In this example, the connections 525-528 couple the die 510 to the antenna unit 552.

A face down die 532. IPD 530, and thru mold vias 560-561 are coupled to the die 510 via solder balls or bumps. The thru mold connections 560-563 are coupled to the substrate 450 using solder balls or bumps. The thru mold connections 562-563 couple a face up die 536 to the substrate 550. A thru mold connections 563 is coupled to a thru substrate via 565 for an electrical connection between circuitry of the die 536 and the substrate 550. Die 532 includes a through substrate connection 566 for an electrical connection between circuitry of the die 532 and the substrate 550. In this manner any signals including RF signals can be communicated between these components without passing through the interposer substrate 522 and this shorter path reduces path losses. Additionally, an upper conductive layer of the die 510 can route signals from the die 510 or the electrically coupled components of the overmolded component 531 to the substrate 550 using connections (or vias) of the interposer substrate 522 for electrical connections between these components. In one example, a pitch of the pads (and corresponding balls or bumps) of the dies 530 and 532 matches or equals a pitch of the pads of the die 510.

If a total height of the overmolded component 531 is greater than a certain height (e.g., greater than 50 microns, greater than 100 microns) then an interposer substrate 522 or pillars are needed for assembling the substrate above the interposer substrate 522. If a total height of the overmolded component is less than a certain height (e.g., 50 microns, 100 microns) then bumps can be used instead of the interposer substrate. In one example, the interposer substrate 522 has a useful function of providing shielding of the RF dies (e.g., dies 532, 536). Grounded deep vias of the interposer substrate can provide shielding while other components of the interposer substrate can provide a power supply for the microelectronic device 500. In another example, RF shielding of dies located within the overmolded component 531 can be provided by using peripheral thru mold connections (e.g., thru mold connection 560). A thru mold connection 561 can be replaced with a thru mold connection that is located near a periphery of the overmolded component 531 or an additional thru mold connection can be added near a periphery of the component 531 (e.g., opposite the thru mold connection 560).

In one embodiment, high power, high efficiency power amplifiers, switches, and/or combiners are formed with compound semiconductor materials on the dies 532 and 536, which are included in the overmolded component 531. The dies 532 and 530 are directly assembled on the silicon die 510 with solder balls or bumps 512 separating the die 510 and the dies 532 and 530. In one example, the die 510 can have dimensions ranging from approximately 200×200 microns to 1×1 millimeter. This multi die or multichip which includes dies 510, 530, 532, and 536, can then be flip-chipped on a high density interconnect package (e.g., interposer substrate 522) that provides power distribution as well as shielding of RF circuitry with peripheral ground vias.

In one embodiment, the antenna unit 552 is located on the microelectronic device 500 as close as possible to power amplifiers (e.g., power amplifiers of dies 532 or 536) to minimize path losses. The substrate 550 in FIG. 5 has been decoupled and separated from other substrates and components of the microelectronic device 500 to reduce cost of the device 500 due to lower cost materials for the substrate. In one example, the signals feeding the antenna unit 552 passes from at least one of the dies 532 and 530 through the solder balls or bumps 512 to an upper conductive layer of the die 510 and then through vias of the interposer substrate 522 to the antenna unit 552.

It will be appreciated that, in a system on a chip embodiment, the die may include a processor, memory, communications circuitry and the like. Though a single die is illustrated, there may be none, one or several dies included in the same region of the wafer.

In one embodiment, the microelectronic device may be a crystalline substrate formed using a bulk silicon or a silicon-on-insulator substructure. In other implementations, the microelectronics device may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of embodiments of the present invention.

Figure 6:
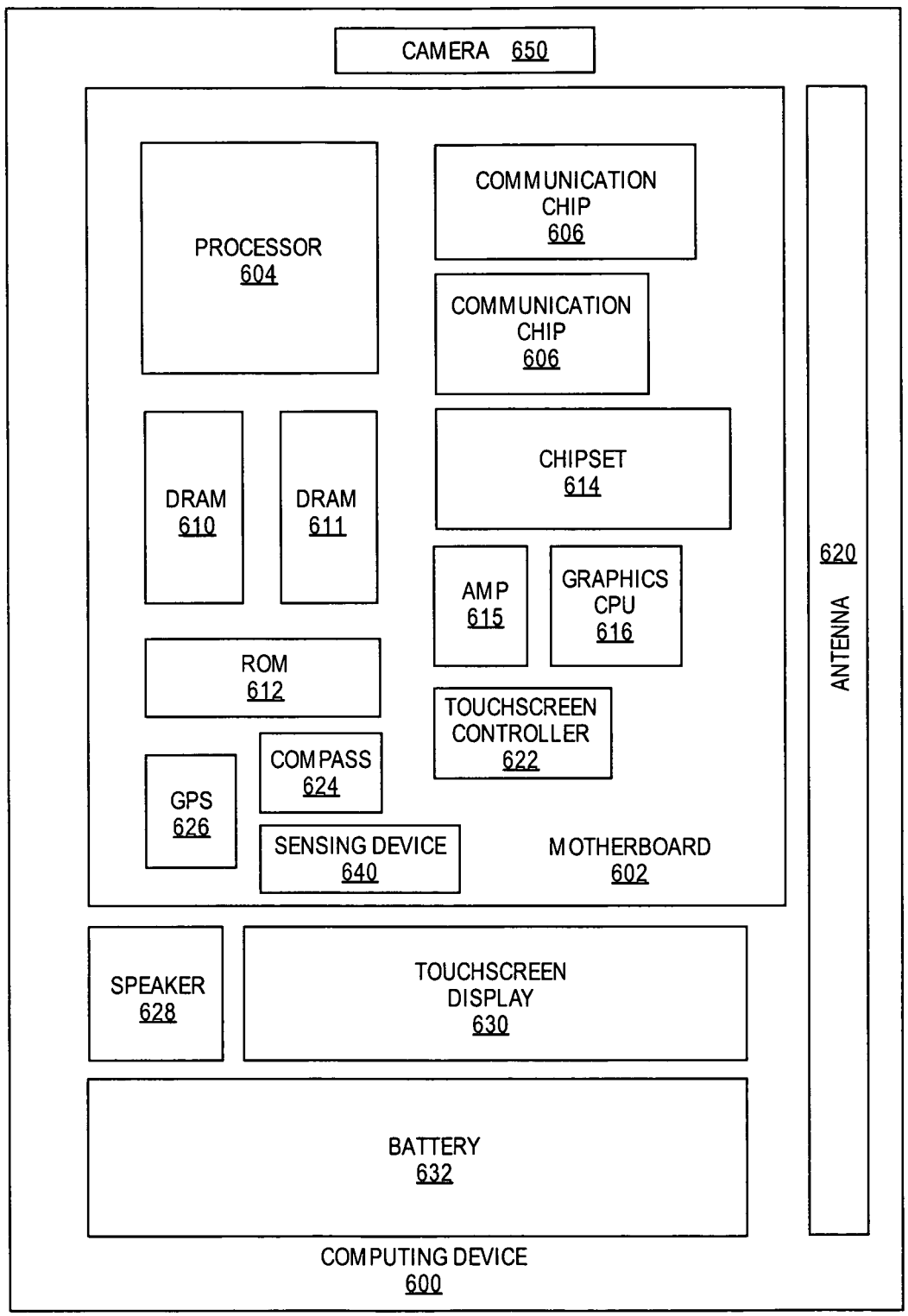
FIG. 6 illustrates a computing device 600 in accordance with one embodiment.

FIG. 6 illustrates a computing device 600 in accordance with one implementation of the invention. The computing device 600 houses a board 602. The board 602 may include a number of components, including but not limited to at least one processor 604 and at least one communication chip 606. The at least one processor 604 is physically and electrically coupled to the board 602. In some implementations, the at least one communication chip 606 is also physically and electrically coupled to the board 602. In further implementations, the communication chip 606 is part of the processor 604. In one example, the communication chip 606 (e.g., microelectronic device 100, 200, 300, 400, 500, etc.) includes an antenna unit 620 (e.g., antenna unit 152, 252, 352, 552, etc.).

Depending on its applications, computing device 600 may include other components that may or may not be physically and electrically coupled to the board 602. These other components include, but are not limited to, volatile memory (e.g., DRAM 910, 911), non-volatile memory (e.g., ROM 912), flash memory, a graphics processor 616, a digital signal processor, a crypto processor, a chipset 614, an antenna unit 620, a display, a touchscreen display 630, a touchscreen controller 622, a battery 632, an audio codec, a video codec, a power amplifier 615, a global positioning system (GPS) device 626, a compass 624, a gyroscope, a speaker, a camera 650, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), WiGig, IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi, WiGig, and Bluetooth and a second communication chip 606 may be dedicated to longer range wireless communications such as GPS, EDGE, GPRS, CDMA. WiMAX, LTE, Ev-DO, 5G. and others.

The at least one processor 604 of the computing device 600 includes an integrated circuit die packaged within the at least one processor 604. In some implementations of the invention, the integrated circuit die of the processor includes one or more devices, such as microelectronic devices (e.g., microelectronic device 100, 200, 300, 400, 500, etc.) in accordance with implementations of embodiments of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of embodiments of the invention, the integrated circuit die of the communication chip includes one or more microelectronic devices (e.g., microelectronic device 100, 200, 300, 400, 500, etc.).

The following examples pertain to further embodiments. Example 1 is a microelectronic device that includes a first die having a silicon based substrate and a second die coupled to the first die. The second die is formed with compound semiconductor materials in a different substrate. The microelectronic device includes a substrate that is coupled to the first die with a plurality of connections (or vias). The substrate includes an antenna unit for transmitting and receiving communications at a frequency of approximately 4 GHz or higher.

In example 2, the subject matter of example 1 can optionally include an integrated passive die (IPD) that is coupled to at least one die (e.g., the first die) with a routing layer or bumps. The IPD may include passives for passive matching networks.

In example 3, the subject matter of any of examples 1-2 can optionally include at least one power amplifier formed with the compound semiconductor materials of the second die.

In example 4, the subject matter of any of examples 1-3 can optionally include an interposer substrate to provide a spacing between the first die and the substrate and to electrically couple the first die and the substrate.

In example 5, the subject matter of any of examples 1-4 can optionally include the interposer substrate having a shield for shielding RF signals of the second die and a power supply.

In example 6, the subject matter of any of examples 1-5 can optionally include a third die coupled to the first die. The third die includes at least one switch formed in compound semiconductor materials.

In example 7, the subject matter of any of examples 1-6 can optionally include the microelectronic device including a 5G package architecture for 5G communications.

In example 8, the subject matter of any of examples 1-7 can optionally include the first die being flip-chipped on a surface of the interposer substrate.

Example 9 is a microelectronic device that includes a first die having a silicon based substrate and an overmolded component having a plurality of dies including a second die that is coupled to the first die. The second die is formed with compound semiconductor materials. A substrate is coupled to the first die with a plurality of connections. The substrate includes an antenna unit for transmitting and receiving communications at a frequency of approximately 15 GHz or higher.

In example 10, the subject matter of example 9 can optionally include the plurality of dies of the overmolded component further comprising an integrated passive die (IPD) coupled to at least one die (e.g., the first die). The IPD includes passives for passive matching networks.

In example 11, the subject matter of any of examples 9 and 10 can optionally include the overmolded component including a plurality of thru mold connections for shielding RF signals of the second die.

In example 12, the subject matter of any of examples 9-11 can optionally include an interposer substrate to provide a spacing between the first die and the substrate and to electrically couple the first die and the substrate.

In example 13, the subject matter of any of examples 9-12 can optionally include the interposer substrate comprising a shield for shielding RF signals of the second die and a power supply.

In example 14, the subject matter of any of examples 9-13 can optionally include a third die coupled to the substrate with a thru mold connection.

In example 15, the subject matter of any of examples 9-14 can optionally include the microelectronic device being a 5G package architecture for 5G communications.

In example 16, the subject matter of any of examples 9-15 can optionally include the overmolded component comprising at least one thru mold connection to couple the first die and the substrate.

Example 17 is a computing device comprising at least one processor to process data and a communication module or chip coupled to the at least one processor. The communication module or chip comprises a first die having a silicon based substrate and a second die coupled to the first die. The second die is formed with compound semiconductor material. A substrate is coupled to the first die with a plurality of connections. The substrate includes an antenna unit for transmitting and receiving communications at a frequency of approximately 15 GHz or higher.

In example 18, the subject matter of example 17 can optionally include the computing device that further comprises an integrated passive die (IPD) that is coupled to at least one die (e.g., the first die) with a routing layer or bumps. The IPD includes passives for passive matching networks.

In example 19, the subject matter of any of examples 17-18 can optionally include at least one power amplifier formed with the compound semiconductor materials of the second die.

In example 20, the subject matter of any of examples 17-19 can optionally include an interposer substrate to provide a spacing between the first die and the substrate and to electrically couple the first die and the substrate.

In example 21, the subject matter of any of examples 17-20 can optionally include the interposer substrate comprising a shield for shielding RF signals of the second die and a power supply.

In example 22, the subject matter of any of examples 17-21 can optionally include a memory, a display module, and an input module, the memory, display module and input module being in operative communication on a chip chipset platform and each other.

What is claimed is:

1. A microelectronic device comprising:
   a first die having a silicon based substrate;
   a second die coupled to the first die by a routing layer, the routing layer located vertically between the first die and the second die;
   the second die being formed with compound semiconductor materials in a different substrate; and
   a substrate coupled to the first die with a plurality of connections, the substrate including an antenna unit for transmitting and receiving communications at a frequency of approximately 4 GHz or higher, wherein the substrate is over the second die, and wherein the antenna unit is completely over the second die.

2. The microelectronic device of claim 1 further comprising:
   an integrated passive die (IPD) coupled to at least one die with the routing layer or bumps, the IPD includes passives for passive matching networks.

3. The microelectronic device of claim 1, wherein the second die further comprises at least one power amplifier formed with the compound semiconductor materials of the second die.

4. The microelectronic device of claim 1, further comprising:
   an interposer substrate to provide a spacing between the first die and the substrate and to electrically couple the first die and the substrate.

5. The microelectronic device of claim 4, wherein the interposer substrate comprises a shield for shielding RF signals of the second die and a power supply.

6. The microelectronic device of claim 1, further comprising:

a third die coupled to the first die, the third die having at least one switch formed in compound semiconductor materials.

7. The microelectronic device of claim 1, wherein the microelectronic device comprises a 5G package architecture for 5G communications and beyond.

8. The microelectronic device of claim 1, wherein the first die is flip-chipped on a surface of the interposer substrate.

9. A microelectronic device comprising:
a first die having a silicon based substrate;
an overmolded component having a plurality of dies including a second die that is coupled to the first die by a routing layer, the routing layer located vertically between the first die and the second die;
the second die being formed with compound semiconductor materials; and
a substrate coupled to the first die with a plurality of connections, the substrate including an antenna unit for transmitting and receiving communications at a frequency of approximately 15 GHz or higher, wherein the substrate is over the second die, and wherein the antenna unit is completely over the second die.

10. The microelectronic device of claim 9 wherein the plurality of dies of the overmolded component further comprises:
an integrated passive die (IPD) coupled to at least one die, the IPD includes passives for passive matching networks.

11. The microelectronic device of claim 9, wherein the overmolded component comprises a plurality of thru mold connections for shielding RF signals of the second die.

12. The microelectronic device of claim 9, further comprising:
an interposer substrate to provide a spacing between the first die and the substrate and to electrically couple the first die and the substrate.

13. The microelectronic device of claim 12, wherein the interposer substrate comprises a shield for shielding RF signals of the second die and a power supply.

14. The microelectronic device of claim 9, further comprising:
a third die coupled to the substrate with a thru mold connection.

15. The microelectronic device of claim 9, wherein the microelectronic device comprises a 5G package architecture for 5G communications.

16. The microelectronic device of claim 9, wherein the overmolded component comprises at least one thru mold connection to couple the first die and the substrate.

17. A computing device comprising:
at least one processor to process data; and
a communication module or chip coupled to the at least one processor, the communication module or chip comprises, a first die having a silicon based substrate, a second die coupled to the first die by a routing layer, the routing layer located vertically between the first die and the second die, the second die being formed with compound semiconductor materials, and a substrate coupled to the first die with a plurality of connections, the substrate including an antenna unit for transmitting and receiving communications at a frequency of approximately 15 GHz or higher, wherein the substrate is over the second die, and wherein the antenna unit is completely over the second die.

18. The computing device of claim 17 further comprising:
an integrated passive die (IPD) coupled to at least one die with a routing layer or bumps, the IPD includes passives for passive matching networks.

19. The computing device of claim 17, wherein the second die further comprises at least one power amplifier formed with the compound semiconductor materials of the second die.

20. The computing device of claim 17, further comprising:
an interposer substrate to provide a spacing between the first die and the substrate and to electrically couple the first die and the substrate.

21. The computing device of claim 20, wherein the interposer substrate comprises a shield for shielding RF signals of the second die and a power supply.

22. The computing device of claim 17, further comprising:
a memory;
a display module; and
an input module, the memory, display module and input module being in operative communication on a chip chipset platform and each other.

* * * * *